United States Patent
Zhang et al.

(10) Patent No.: US 8,606,381 B2
(45) Date of Patent: Dec. 10, 2013

(54) METHOD AND DEVICE FOR SWITCHING AUDIO RECORDING MODES

(75) Inventors: Chen Zhang, Beijing (CN); Yuhong Feng, Beijing (CN)

(73) Assignee: Wuxi Vimicro Corporation, Wuxi, Jiangsu (CN)

( * ) Notice: Subject to any disclaimer, the term of this patent is extended or adjusted under 35 U.S.C. 154(b) by 1132 days.

(21) Appl. No.: 12/511,049

(22) Filed: Jul. 28, 2009

(65) Prior Publication Data

US 2010/0168882 A1 Jul. 1, 2010

(30) Foreign Application Priority Data

Dec. 25, 2008 (CN) .......................... 2008 1 0241029

(51) Int. Cl.
*G06F 17/00* (2006.01)

(52) U.S. Cl.
USPC ............. 700/94; 381/104; 381/105; 381/106; 381/107; 381/108; 381/109

(58) Field of Classification Search
USPC .................................... 700/94; 381/104–109
See application file for complete search history.

(56) References Cited

U.S. PATENT DOCUMENTS

| | | | | |
|---|---|---|---|---|
| 5,479,562 A | * | 12/1995 | Fielder et al. | 704/229 |
| 6,031,478 A | * | 2/2000 | Oberhammer et al. | 341/155 |
| 6,317,065 B1 | * | 11/2001 | Raleigh et al. | 341/139 |
| 6,377,196 B1 | * | 4/2002 | Kolsrud et al. | 341/118 |
| 6,724,897 B1 | * | 4/2004 | Smith | 381/61 |
| 7,231,006 B2 | * | 6/2007 | Yamauchi | 375/345 |
| 7,365,664 B2 | * | 4/2008 | Caduff et al. | 341/139 |
| 7,606,544 B2 | * | 10/2009 | Hennig | 455/247.1 |
| 7,952,502 B2 | * | 5/2011 | Kolze et al. | 341/118 |
| 8,204,615 B2 | * | 6/2012 | Yamada et al. | 700/94 |
| 8,208,660 B2 | * | 6/2012 | Sollenberger et al. | 381/107 |
| 2006/0141965 A1 | * | 6/2006 | Hennig | 455/247.1 |
| 2006/0187360 A1 | * | 8/2006 | Hutchinson et al. | 348/733 |
| 2007/0103355 A1 | * | 5/2007 | Yamada | 341/155 |
| 2007/0126525 A1 | * | 6/2007 | Nicholson | 333/81 R |
| 2010/0057473 A1 | * | 3/2010 | Kong et al. | 704/500 |

* cited by examiner

*Primary Examiner* — Paul McCord

(74) *Attorney, Agent, or Firm* — Wuxi Sino IP Agency, Ltd; Joe Zheng

(57) ABSTRACT

Techniques pertaining to providing an appropriate recording mode to achieve optimum record data in accordance with the recording environment are described. In one embodiment, a current audio recording mode is initially selected to be one of a low sensitivity audio recording mode and a high sensitivity audio recording mode. A digital gain for digital audio recording data in the current audio recording mode is obtained. The current audio recording mode is automatically switched between the low sensitivity audio recording mode and the high sensitivity audio recording mode when the digital gain reaches a gain threshold.

6 Claims, 3 Drawing Sheets

METHOD AND DEVICE FOR SWITCHING AUDIO RECORDING MODES

BACKGROUND OF THE INVENTION

1. Field of the Invention

The present invention relates to the area of audio signal processing, more particularly to a method and a device for switching audio recording modes.

2. Description of Related Art

A conventional audio recording device generally has two types of audio recording modes, one is a high sensitivity audio recording mode, and the other is a low sensitivity audio recording mode. The high sensitivity audio recording mode is preferred to record high sensitively in a quiet environment, and the low sensitivity audio recording mode is preferred to record low sensitively in a noisy environment. The user may manually select a proper audio recording mode according to the recording environment to achieve the best effects.

Hence, the user has to manually select the audio recording mode before recording every time, which is inconvenient to the user. Furthermore, the recording effect may be unsatisfied if the user selects an improper audio recording mode. Additionally, it has to use the fixed audio recording mode throughout the recording process once the audio recording mode is determined. In this situation, the recording effect may be unsatisfied, the volume of the recording could be too big or too small, if there is a great dynamic sound range in the recording environment.

Thus, improved techniques for a method and a device for switching audio recording modes automatically are desired to overcome the above disadvantages.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention is related to techniques for providing an appropriate recording mode to achieve optimum record data in accordance with a recording environment. In one aspect of the present invention, a current audio recording mode is initially selected to be one of a low sensitivity audio recording mode and a high sensitivity audio recording mode. A digital gain for digital audio recording data in the current audio recording mode is obtained. The current audio recording mode is automatically switched between the low sensitivity audio recording mode and the high sensitivity audio recording mode when the digital gain reaches a gain threshold.

In one embodiment, a sensitivity switch is configured to amplify an analog audio recording signal according to one of a first analog gain and a second analog gain, where the second analog gain is higher than the first analog gain. An A/D converter is provided to convert the analog audio recording signal amplified by the sensitivity switch to digital audio recording data. A first AGC is configured to amplify the digital audio recording data according to a first digital gain and control the first digital gain to an appropriate level. A second AGC is configured to amplify the digital audio recording data according to a second digital gain and control the second digital gain to an appropriate level. An automatic mode transition module is provided to inform the sensitivity switch of using the second analog gain, start the second AGC and stop the first AGC when the first digital gain reaches a first gain threshold; or inform the sensitivity switch of using the first analog gain, start the first AGC and stop the second AGC when the second digital gain reaches a second gain threshold; and wherein the first gain threshold is larger than the second gain threshold.

There are many features, benefits and advantages in the present invention, which will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the invention do not inherently indicate any particular order nor imply any limitations in the invention.

Embodiments of the present invention are discussed herein with reference to FIGS. 1-6. However, those skilled in the art will readily appreciate that the detailed description given herein with respect to these figures is for explanatory purposes only as the invention extends beyond these limited embodiments.

Improved techniques for switching audio recording modes automatically are provided according to one embodiment of the present invention. As a result, a high sensitivity audio recording mode is selected automatically for a quiet environment and a low sensitivity audio recording mode is selected automatically for a noisy environment according to one embodiment of the present invention.

Figure 1:
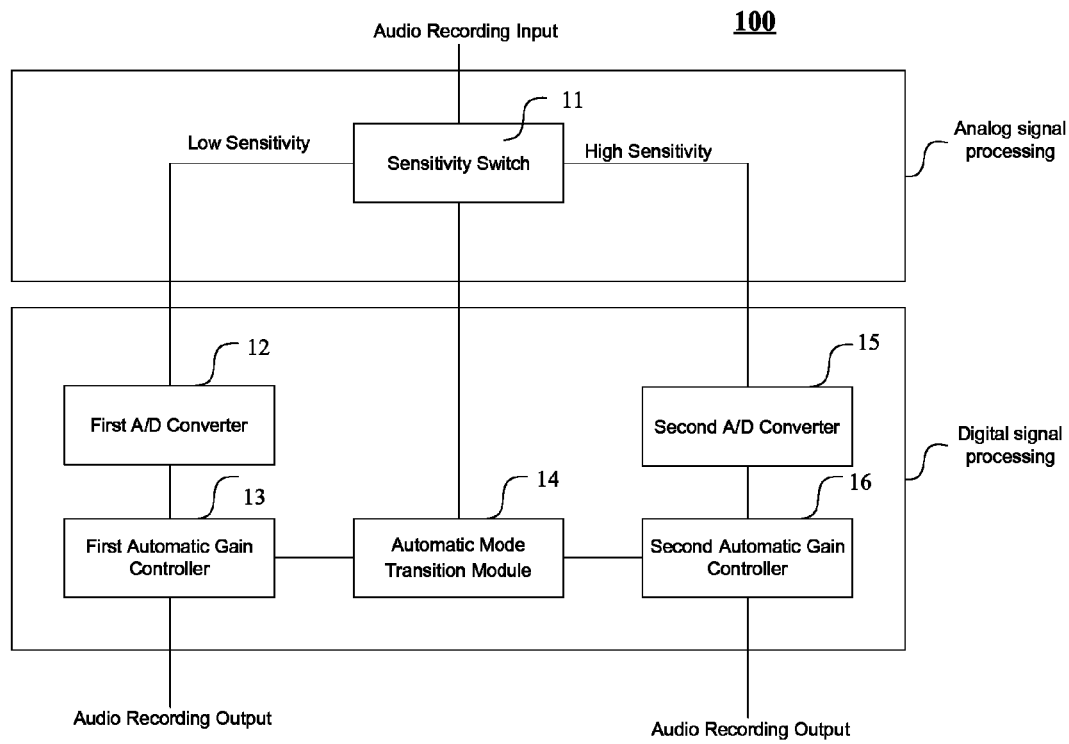
FIG. 1 is a block diagram schematically showing an audio recording system according to one embodiment of the present invention.

FIG. 1 is a block diagram schematically showing an audio recording system 100 according to one embodiment of the present invention. Referring to FIG. 1, the audio recording system 100 comprises a sensitivity switch 11, a first A/D converter 12, a first automatic gain controller (AGC) 13, an automatic mode transition (AMT) module 14, a second A/D Converter 15 and a second automatic gain controller (AGC) 16.

The sensitivity switch 11 is configured to amplify an analog audio recording input according to a first analog gain for the low sensitivity audio recording mode, or amplify the analog audio recording input according to a second analog gain for the high sensitivity audio recording mode. The second analog gain is higher than the first analog gain. Generally, a difference between the first analog gain and the second analog gain may be a predefined value, e.g. 20 dB, 30 dB or other values. In one embodiment, the sensitivity switch 11 may be an analog amplifier with two selectable gains.

The first A/D converter 12 is configured to convert the analog audio recording signal amplified by the sensitivity switch 11 to digital audio recording data. The first AGC 13 is configured to amplify the digital audio recording data according to a first digital gain to produce an audio recording output, and adjust the first digital gain to an appropriate level to ensure that the volume of the audio recording output enters into an appropriate range. The first A/D converter 12 and the first AGC 13 work in the low sensitivity audio recording mode.

Correspondingly, the second A/D converter 15 is configured to convert the analog audio recording signal amplified by the sensitivity switch 11 to digital audio data. The second AGC 16 is configured to amplify the digital audio recording data according to a second digital gain to produce an audio recording output, and adjust the second digital gain to an appropriate level to ensure that the volume of the audio recording output enters into an appropriate range. The second A/D converter 15 and the second AGC 16 work in the high sensitivity audio recording mode. It is noted that the functions of the first A/D converter 12 may be identical to that of the second A/D converter 15, and the functions of the first AGC 13 may be identical to that of the second AGC 16.

In the low sensitivity audio recording mode, the Automatic Mode Transition (AMT) module 14 is configured to obtain the first digital gain from the first AGC 13, determine whether the first digital gain reaches a maximum digital gain (also referred as a first gain threshold) of the first AGC 13, switch to the high sensitivity audio recording mode from the low sensitivity audio recording mode if yes, and maintain the low sensitivity audio recording mode otherwise. When the AMT module 14 switches to the high sensitivity audio recording mode from the low sensitivity audio recording mode, the AMT module 14 may send a mode switch signal to substitute the second analog gain for the first analog gain, stop the first A/D converter 12 and the first AGC 13, and start the second A/D converter 15 and the second AGC 16. When the AMT module 14 maintains the low sensitivity audio recording mode, the AMT module 14 may send a mode keep signal to maintain current states of the sensitivity switch 11, the first A/D converter 12 and the first AGC 13.

In the high sensitivity audio recording mode, the AMT module 14 is configured to obtain the second digital gain from the second AGC 16. It also determines whether the second digital gain has reached a minimum digital gain (also referred as a second gain threshold) of the second AGC 16, switches to the low sensitivity audio recording mode from the high sensitivity audio recording mode if the minimum digital gain has reached, and otherwise maintains the high sensitivity audio recording mode. When the AMT module 14 switches to the low sensitivity audio recording mode from the high sensitivity audio recording mode, the AMT module 14 sends a mode switch signal to substitute the first analog gain for the second analog gain, stop the second A/D converter 15 and the second AGC 16, and start the first A/D converter 12 and the first AGC 13. When the AMT module 14 maintains the high sensitivity audio recording mode, the AMT module 14 may send a mode keep signal to maintain a current state of the sensitivity switch 11, the second A/D converter 15 and the second AGC 16.

In initialization, one of the high sensitivity audio recording mode and the low sensitivity audio recording mode is used as an audio recording default mode of the audio recording system 100. After the audio recording system 100 starts up, the AMT module 14 selects one proper audio recording mode automatically according to the current recording environment.

In one embodiment, the first A/D converter 12 and the second A/D 15 may be the same A/D converter. In other words, only one A/D converter is provided in the audio recording system 100 and is configured to convert the analog audio recording signal amplified via the sensitivity switch 11 to digital audio data in the two audio recording modes.

In operation, an AGC may initially obtain a signal amplitude value Vmax with maximum absolute value from a current frame of the digital audio recording data and compare the signal amplitude value Vmax with a target threshold Ti to produce an ideal digital gain gain_t thereof, wherein gain_t=Ti/Vmax and Ti is an ideal value that the signal amplitude of the audio recording output is desired to reach.

It requires to smooth changes of the digital gain of the AGC because rapid changes of the digital gain may result in noise. So, a following smooth operation is performed:

$$\text{gain}=\text{gain\_old}-\text{step1, if gain\_}t<\text{gain\_old};$$

wherein gain_old is a final digital gain of a last frame, gain_t is the ideal digital gain of the current frame, step1 is a step during decreasing the digital gain gain, and a minimum value of the digital gain gain is a minimum digital gain of the AGC 13 or 16;

$$\text{gain}=\text{gain\_old}+\text{step2, if gain\_}t>\text{gain\_old};$$

wherein step2 is a step during increasing the digital gain gain, a maximum value of the digital gain gain is a maximum digital gain of the AGC 13 or 16.

Then, the digital gain of the AGC is further intra-frame smoothed according to the following formula:

$$\text{gainW}(i)=b(i)\text{gain\_old}+(1-b(i))\text{gain}, i=0\sim N-1;$$

wherein gainW(i) is the digital gain of the ith sample in the current frame, N is the number of samples in one frame, e.g. N=128, and b(i) is a slop function.

Figure 2:
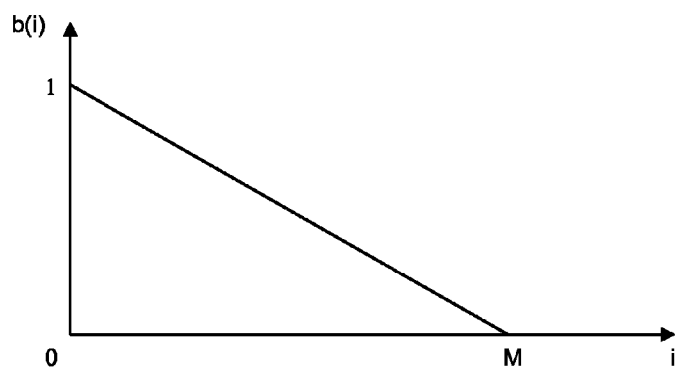
FIG. 2 is a diagram showing an example of a slop function according to one embodiment of the present invention.

FIG. 2 is a diagram showing an example of the slop function b(i), wherein b(i)=1−i/N. It can be seen that the final digital gain of the last frame gain_old is assigned. On the contrary, the final digital gain of the last frame gain_old is assigned with a smaller weight and the digital gain of the current frame gain is assigned with a larger weight at the end of the current frame.

Finally, the AGC is configured to amplify the digital audio recording data input(i) according to the digital gain gainW(i) to produce the audio recording output output(i), wherein output(i)=input(i)*gainW(i).

Figure 3:
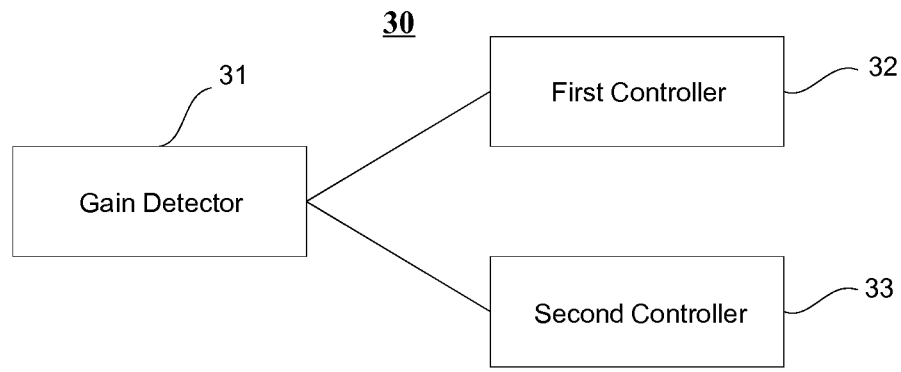
FIG. 3 shows an exemplary functional block diagram of an automatic mode transition module that may corresponds to the automatic mode transition module of FIG. 1.

The AMT module 14 is a core module of the audio recording system 100. FIG. 3 is an exemplary functional block diagram 30 of the AMT module 14. Referring to FIG. 3, the AMT module 30 comprises a gain detector 31, a first controller 32 and a second controller 33.

The gain detector 31 is configured to obtain the first digital gain from the first AGC 13 and determine whether the first digital gain reaches to a first gain threshold in the low sensitivity audio recording mode; and obtain the second digital gain from the second AGC 16 and determine whether the second digital gain reaches to a second gain threshold in the high sensitivity audio recording mode. The first controller 32 is configured to instruct the sensitivity switch 11 to substitute the second analog gain for the first analog gain, start the second AGC 16 and stop the first AGC 13 when the first digital gain reaches to the first gain threshold in the low sensitivity audio recording mode. The second controller 33 is configured to instruct the sensitivity switch 11 to substitute the first analog gain for the second analog gain, start the first AGC 13 and stop the second AGC 16 when the second digital gain reaches to the second gain threshold in the high sensitivity audio recording mode.

However, the transition between the high sensitivity audio recording mode and the low sensitivity audio recording mode may result in noise.

Provided that the difference between the first analog gain and the second analog gain is 20 bB. When the low sensitivity audio recording mode is switched to the high sensitivity audio recording mode, the analog gain of the sensitivity switch 11 is increased by 20 dB because the second analog gain is substituted for the first analog gain so that the signal amplitude is amplified by 10 times. In order to ensure that the overall gain including the second analog gain of the sensitivity switch 11 and the second digital gain of the second AGC 16 has no sudden change, the second digital gain of the second AGC 16 is required to be decreased by 20 dB so that the signal amplitude is amplified by 1/10 times again. Hence, when the low sensitivity audio recording mode is switched to the high sensitivity audio recording mode, the final digital gain gain_old of the last frame is:

$$gain\_old = HihgLimit/10,$$

wherein HighLimit herein is the maximum digital gain of the first AGC 13.

Similarly, when the high sensitivity audio recording mode is switched to the low sensitivity audio recording mode, the analog gain of the sensitivity switch 11 is decreased by 20 dB because the first analog gain is substituted for the second analog gain so that the signal amplitude is amplified by 1/10 times. In order to ensure that the overall gain including the first analog gain of the sensitivity switch 11 and the first digital gain of the first AGC 13 has no sudden change, the first digital gain of the first AGC 13 is required to be increased by 20 dB so that the signal amplitude is amplified by 10 times. Hence, when the high sensitivity audio recording mode is switched to the low sensitivity audio recording mode, the final digital gain gain_old of the last frame is:

$$gain\_old = LowLimit*10$$

wherein LowLimit herein is the minimum digital gain of the second AGC 16.

Additionally, the audio recording system may switch between the high sensitivity audio recording mode and the low sensitivity audio recording mode frequently if the minimum digital gain LowLimit of the second AGC 16 is near to the maximum digital gain HighLimit of the first AGC 13. In order to solve this problem, the following formula is satisfied according to one embodiment in the present invention:

$$HighLimit > 10*LowLimit.$$

Figure 4:
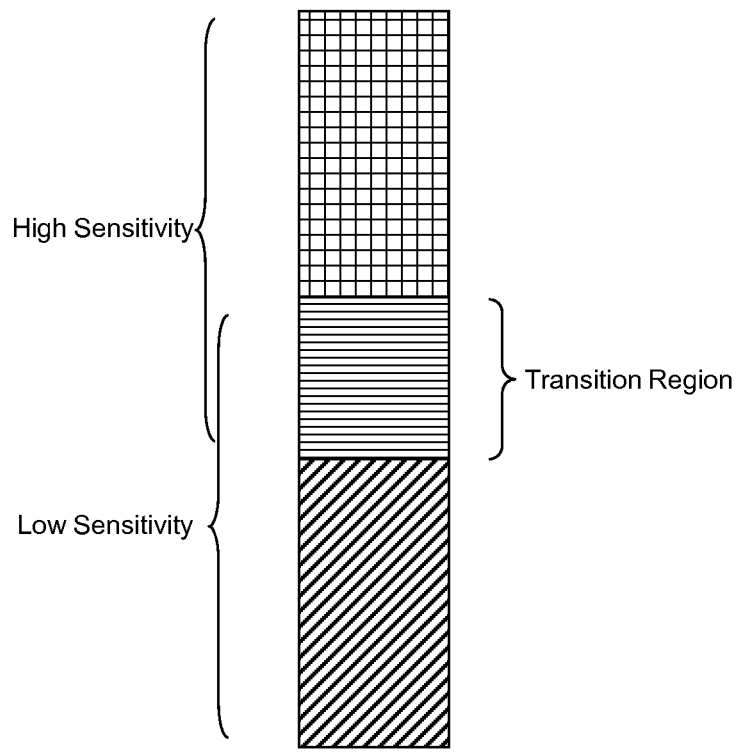
FIG. 4 is a diagram schematically showing a transition region between a high sensitivity audio recording mode and a low sensitivity audio recording mode.

Referring to FIG. 4, there is a transition region between the high sensitivity audio recording mode and the low sensitivity audio recording mode, thereby preventing the audio recording system from frequently switching between the two audio recording modes.

Furthermore, the audio recording system comprises an analog signal processing part and a digital signal processing part. So, there may be several frames delay from the AMT 14 sending the mode switch signal to the sensitivity switch 11 to the AGC 13 or 16 receiving the digital audio recording data in the switched audio recording mode. The delay frame number may be got by testing the audio recording system. The delay may cause the analog gain control of the sensitivity switch 11 to be not synchronized with the digital gain control of the AGC 13 or 16, thereby resulting in noise. Hence, it needs to compensate the delay in the present invention.

Provided that the delay between the digital gain control and the analog gain control for the same frame of audio signal is T frames. After the AMT 14 sends the mode switch signal from the low sensitivity audio recording mode to the high sensitivity audio recording mode, it needs to delay T to stop the first AGC 13 and start the second AGC 16.

Similarly, after the AMT 14 sends the mode switch signal from the high sensitivity audio recording mode to the low sensitivity audio recording mode, it needs to delay a predefined number of frames to stop the second AGC 16 and start the first AGC 13. It should be noted that the delay predefined number should be T+1, but not T. The switch time between the audio recording modes doesn't necessarily occur in a frame header, and most likely occur in an intra frame. As described above, the first digital gain of the first AGC 13 is required to be increased by 20 dB when the high sensitivity audio recording mode is switched to the low sensitivity audio recording mode. Hence, the switch between the first AGC 13 and the second AGC 16 should be delayed T+1 frames to avoid great noise induced because the analog gain of the sensitivity switch 11 and the digital gain of the AGC 16 are increased by 20 dB simultaneously for the same frame.

Hence, after the AMT 14 sends the mode switch signal from the high sensitivity audio recording mode to the low sensitivity audio recording mode, it needs to delay T+1 frames to stop the second AGC 16 and start the first AGC 13.

Figure 5:
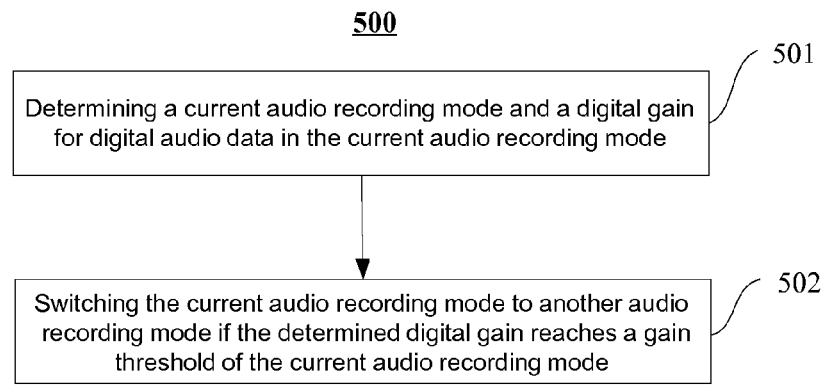
FIG. 5 is a general flowchart schematically showing a method for switching audio recording modes according to one embodiment of the present invention.

FIG. 5 is a general flowchart schematically showing a method 500 for switching audio recording modes according to one embodiment of the present invention. Referring to FIG. 5, the method 500 comprises the following operations.

At 501, a current audio recording mode and a digital gain for digital audio data in the current audio recording mode are determined. The current audio recording mode is one of the low sensitivity audio recording mode and the high sensitivity audio recording mode.

At 502, the current audio recording mode is switch to another audio recording mode if the determined digital gain reaches a gain threshold of the current audio recording mode.

Figure 6:
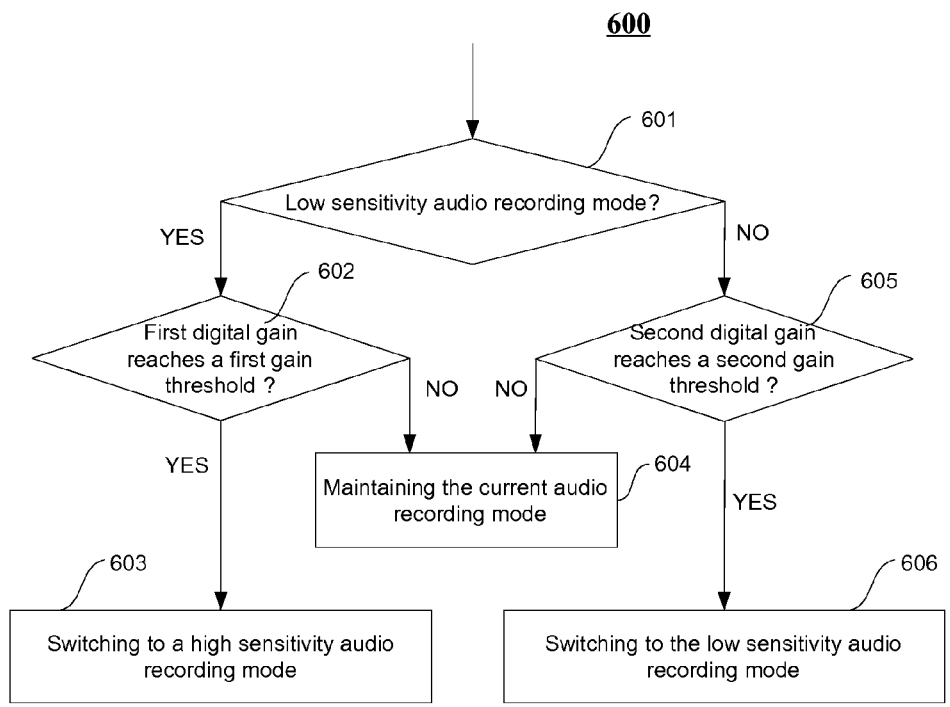
FIG. 6 is a specific flowchart schematically showing a method for switching audio recording modes according to another embodiment of the present invention.

FIG. 6 is a specific flowchart schematically showing a method 600 for switching audio recording modes according to another embodiment of the present invention. Referring to FIG. 6, the method 600 comprises the following operations.

At 601, it is determined whether the current audio recording mode is the low sensitivity audio recording mode. The YES branch leads to 602, and the NO branch leads to 605.

At 602, it is determined whether the first digital gain obtained from the first AGC 13 reaches the first gain threshold. If YES, the method is taken to 603, where the low sensitivity audio recording mode is switched to the high sensitivity audio recording mode; otherwise, the method is taken to 604, where the low sensitivity audio recording mode is maintained. When the low sensitivity audio recording mode is switched to the high sensitivity audio recording mode, the mode switch signal is sent to instruct the sensitivity switch 11 to substitute the second analog gain for the first analog gain, start the second AGC 16 and stop the first AGC 13 after T frames delay.

At 605, it is determined whether the second digital gain obtained from the second AGC 16 reaches the second gain threshold. If YES, the method is taken to 605, where the high sensitivity audio recording mode is switched to the low sensitivity audio recording mode; otherwise, the method is taken to 604, where the high sensitivity audio recording mode is maintained. When the high sensitivity audio recording mode is switched to the low sensitivity audio recording mode, the mode switch signal is sent to instruct the sensitivity switch 11 to substitute the first analog gain for the second analog gain, start the first AGC 13 and stop the second AGC 16 after T+1 frames delay.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. A method for switching audio recording modes, the method comprising:
   receiving an audio signal;
   determining a current audio recording mode being one of a low sensitivity audio recording mode and a high sensitivity audio recording mode;
   routing the audio signal to a first signal path according to the current audio recording mode, wherein each of the first and second signal paths includes an analog-to-digital (ADC) and an automatic gain controller (AGC);
   obtaining a digital gain from the first signal path for digital audio recording data in the current audio recording mode; and
   switching to route the audio signal to the second signal path when the digital gain reaches a gain threshold,
   wherein when the current audio recording mode is the low sensitivity audio recording mode, the method further comprises:
     amplifying the audio signal according to a first analog gain of a sensitivity switch;
     converting the amplified audio signal to digital audio recording data; and
     amplifying the digital audio recording data according to the first digital gain of the automatic gain controller in the first signal path;
   wherein when the current audio recording mode is the high sensitivity audio recording mode, the method further comprises:
     amplifying the audio signal according to a second analog gain by the sensitivity switch;
     converting the amplified audio signal to digital audio recording data; and
     amplifying the digital audio recording data according to the second digital gain of the automatic gain controller in the second signal path; wherein the second analog gain is larger than the first analog gain;
   wherein when the low sensitivity audio recording mode is switched to the high sensitivity audio recording mode, the method further comprises:
     informing the sensitivity switch to substitute the second analog gain for the first analog gain; and
     starting the automatic gain controller in the second signal path after delaying a first predefined number of frames in the audio signal;
   wherein when the high sensitivity audio recording mode is switched to the low sensitivity audio recording mode, the method further comprises:
     informing the sensitivity switch to substitute the first analog gain for the second analog gain; and
     starting the automatic gain controller in the first signal path after delaying a second predefined number of frames in the audio signal; and wherein the second predefined number is larger than the first predefined number.

2. The method according to claim 1, wherein when the current audio recording mode is the low sensitivity audio recording mode,
   said obtaining a digital gain for digital audio recording dada in the current audio recording mode comprises: obtaining a first digital gain for the digital audio recording data from the automatic gain controller in the first signal path; and
   said switching to route the audio signal to the second signal path comprises: routing the audio signal to the second signal path automatically when the first digital gain reaches a first gain threshold.

3. The method according to claim 1, wherein when the current audio recording mode is the high sensitivity audio recording mode,
   said obtaining a digital gain from the first signal path for digital audio recording dada in the current audio recording mode comprises: obtaining a second digital gain for the digital audio recording data from the automatic gain controller in the second signal path; and
   said switching to route the audio signal to the second signal path comprises: routing the audio signal to the second signal path automatically when the second digital gain reaches a second gain threshold, and wherein the first gain threshold is larger than the second gain threshold.

4. The method according to claim 3, wherein the first gain threshold is 10 times larger than the second gain threshold.

5. An audio recording system, the system comprising:
   a sensitivity switch configured to receive and amplify an analog audio recording signal according to one of a first analog gain and a second analog gain, wherein the second analog gain is higher than the first analog gain;
   an A/D converter configured to convert the analog audio recording signal amplified by the sensitivity switch to digital audio recording data;
   a first AGC configured to amplify the digital audio recording data according to a first digital gain and control the first digital gain to an appropriate level;
   a second AGC configured to amplify the digital audio recording data according to a second digital gain and control the second digital gain to an appropriate level;
   an automatic mode transition module configured to inform the sensitivity switch to use the second analog gain, start the second AGC when the first digital gain reaches a first gain threshold; or to inform the sensitivity switch to use the first analog gain, start the first AGC when the second digital gain reaches a second gain threshold; and wherein the first gain threshold is larger than the second gain threshold, wherein the automatic mode transition module delays a first predefined number of frames to start the second AGC after the automatic mode transition module informs the sensitivity switch to use the second analog gain, the automatic mode transition module delays a second predefined number of frames to start the first AGC after the automatic mode transition module informs the sensitivity switch to use the first analog gain, and the second predefined number is larger than the first predefined number.

6. The audio recording system according to claim 5, wherein the first gain threshold is 10 times larger than the second gain threshold.

\* \* \* \* \*